United States Patent [19]
Gontowski, Jr.

[11] 4,426,658
[45] Jan. 17, 1984

[54] IC WITH PROTECTION AGAINST REVERSED POWER SUPPLY

[75] Inventor: Walter S. Gontowski, Jr., Thompson, Conn.

[73] Assignee: Sprague Electric Company, North Adams, Mass.

[21] Appl. No.: 221,084

[22] Filed: Dec. 29, 1980

[51] Int. Cl.³ .............................................. H01L 27/04
[52] U.S. Cl. ...................................... 357/48; 357/40; 357/51; 357/59
[58] Field of Search ........................ 357/48, 51, 59, 40; 307/303

[56] References Cited

U.S. PATENT DOCUMENTS

| | | | |
|---|---|---|---|
| 3,829,709 | 8/1974 | Maigret et al. | 307/202 |
| 3,940,785 | 2/1976 | Genesi | 357/48 |
| 4,133,000 | 1/1979 | Greenstein | 357/51 |
| 4,260,910 | 4/1981 | Colman | 357/48 |

OTHER PUBLICATIONS

IBM Technical Disclosure Bulletin, vol. 19, No. 4, Sep. 1976, p. 1161.

Primary Examiner—William D. Larkins

[57] ABSTRACT

A silicon integrated circuit having PN junction isolated components is designed omitting any straight metallic low-ohmic connection between a component-containing epitaxial pocket and the Vcc pad. All such ohmic connections include a dielectrically isolated polysilicon resistor to moderate reverse supply currents from these pockets to substrate. A special epitaxial pocket is ohmically connected through a fuse link to the Vcc pad to drain off any static charge that may accumulate at the Vcc pad during manufacture and assembly. After assembly, the fuse link blows when the supply is reversed, preventing all but a momentary burst of high current from the special pocket to the substrate.

4 Claims, 4 Drawing Figures

IC WITH PROTECTION AGAINST REVERSED POWER SUPPLY

BACKGROUND OF THE INVENTION

This invention relates to an integrated circuit with protection against reversed power supply and more particularly to such a circuit wherein the hot (Vcc) power supply terminal pad is connected through a fusible link and a normally reverse biased PN junction from an epitaxial pocket to the IC substrate, and wherein each ohmic connection between each of the other epitaxial pockets and the hot terminal pad are effected through a polysilicon resistor.

Integrated circuits (IC's) having conventional PN junction isolation of individual components are typically designed to perform digital or analogue functions. They are often powered from a battery, e.g. when used in automobiles, portable equipment or in toys. In these battery powered applications, the danger exists that when replacing a used battery with a fresh one, the new battery may be connected backward from normal.

Most semiconductor integrated circuits are so constructed that a polarity reversal of the d.c. power source will cause permanent and catastrophic damage to the circuit components. It is desirable that low cost protective means against an inadvertently reversed battery, be provided within the integrated circuit itself. A known means for accomplishing this, comprises forming by standard IC methods a normal p-n junction diode in the circuit substrate and connecting this diode in series relationship with the d.c. power supply (battery) and d.c. power buss terminals of the primary portion of the IC. The diode is polarized so that it is "forward biased" when the battery is properly connected and vice versa. Unfortunately, the simplest means for fabricating such a protective diode often results in the formation of a parasitic transistor that degrades the performance of the primary circuit portion. Also, the forward drop of the protective diode, e.g. 0.6 volts, is often intolerable.

An alternative solution is described in the patent to R. Genesi, U.S. Pat. No. 3,940,785 issued Feb. 24, 1976 that is assigned to the same assignee as is the present invention. The epitaxial pockets, containing a diffused resistor or a transistor, which pockets would normally connect directly to the hot (Vcc) terminal pad, are instead connected via a Schottky diode for reversed battery protection. However, even the low forward drop of Schottky diodes may be objectionable for operation at low power supply voltages, and on the other hand the reverse breakdown voltage of the usual integrated Schottky diode is about 20 volts limiting the supply voltage that may be used to less than 20 volts.

It is an object of the present invention to provide an integrated circuit with reverse supply protection that overcomes the above above noted limitations of the prior art.

SUMMARY OF THE INVENTION

An integrated circuit that provides protection against a reversed power supply connection includes a silicon substrate of one conductivity type having grown on one face thereof an epitaxial layer of the other type that is divided into a plurality of PN junction-isolated pockets. An insulative film overlies the outer surface of the epitaxial layer. A pair of metal termination pads are deposited on the insulative film consisting of a ground pad ohmically connected to the substrate and a Vcc pad. This pair of pads is adapted for connecting the integrated circuit to a DC power source.

The integrated circuit of this invention further comprises a plurality of polysilicon resistors having been formed on the insulative film. At least one of the resistors completes an ohmic connection between at least one of the pockets and the Vcc pad. Thus a reversal of the power source that will forward bias the isolation junctions of the at least one pocket results in a nondestructive current that is limited by the resistor. Also included is a fusible link providing a low resistance connection between another but special of the pockets and the Vcc pad. Thus static charge that is acquired by the Vcc pad during manufacture and subsequent assembly into an electrical system will be drained to the substrate to prevent destructively high voltage from building up across the insulative film between the polysilicon resistor and the substrate, and so that after the assembly and on the occasion of inadvertent reverse connection of the DC supply to the pads, the high potentially destructive current that would flow in the forward direction through the PN junction between the special pocket and the substrate will open the fuse link.

When the integrated circuit is properly connected into the system in which it is intended to operate, the PN isolating junction of the special pocket is reverse biased and may be essentially out of the circuit. However, if the power supply is inadvertently reversed, this isolating junction of the special pocket is forward biased and a large current flows momentarily blowing the fusible link and preventing overheating of and permanent damage to the integrated circuit. Since the integrated circuit is at that time installed in the system, the danger of static charge buildup is greatly diminished and protection against it no longer of significant importance. A proper connection of the power supply being subsequently made, the integrated circuit is restored to normal operation and retains the protection feature against any future reversal of the power supply.

The protective diode of this invention, being an epitaxial pocket to substrate diode, is normally reverse biased and out of the circuit. Furthermore, reverse breakdown voltages are typically 60 to 100 volts permitting greater latitude in the choice of the supply voltage. The reverse voltage protection structure of this invention is appropriate for integrated circuits including both or either bipolar and MOS transistors.

DESCRIPTION OF THE PREFERRED EMBODIMENT

Figure 1:
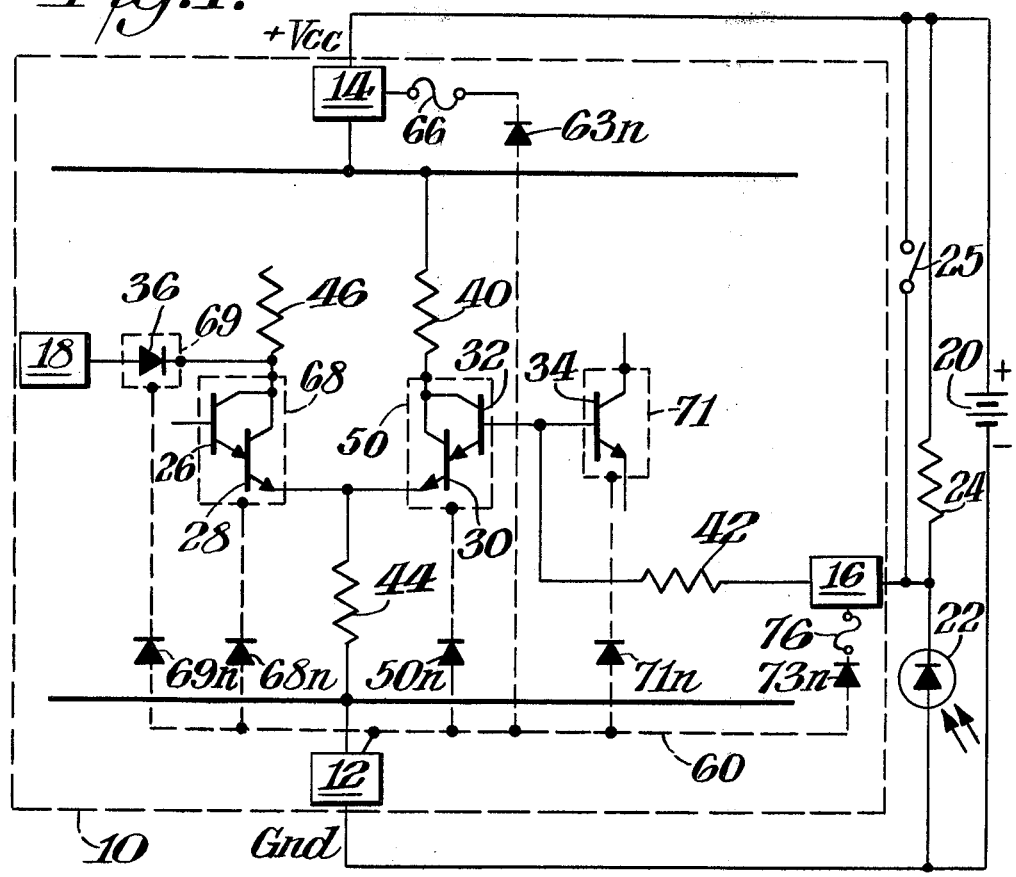
FIG. 1 shows a schematic diagram of a portion of a protected integrated circuit of this invention.

A silicon integrated circuit chip 10 as shown schematically in FIG. 1 has termination pads 12, 14, 16 and 18 by which electrical access is provided to the circuit of the chip. Terminal 12 serves as the circuit ground pad. The chip 10 is intended to be energized from a DC power source 20 via the Vcc pad 14 and ground pad 12. Intermediate points within the circuit are reached through other pads such as pads 17 and 18. Such other pads may typically be used for bias adjustment, attachment of capacitors or other discrete components not readily integrated in the chip 10, and as signal input and output points. A photo diode 22 and associated discrete resistor 24 is shown connected to pad 16 that serves in this case as an input terminal. A switch 25 may be closed to manually simulate a no-light condition.

Figure 2:
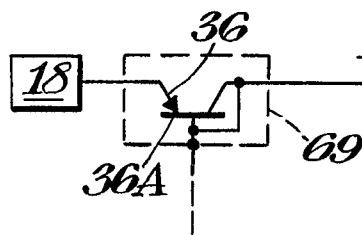
FIG. 2 indicates how the signal diode of FIG. 1 is made from an integrated lateral PNP transistor.

The chip 10 includes the five transistors 26, 28, 30, 32 and 34. There is also an integrated diode 36 that is the emitter to base junction of a lateral PNP transistor 36A as diagramed more explicitly in FIG. 2. Resistors 40 and 42 represent polysilicon resistors while resistors 44 and 46 may be either polysilicon, base-diffused or any other integrated resistor type. Actually, once the committment has been made to make one or two polysilicon resistors, it will be preferred to make the other resistors polysilicon also, or at least the resistors having a value of about 1000 ohms or greater. Polysilicon resistors tend to provide high resistance values whereas diffused resistors are more easily made with low ohmic values. Polysilicon resistors are normally formed over thick-oxide portions of a chip such as over isolation walls and thus advantageously need be allocated no proprietary chip real estate.

Figure 3:
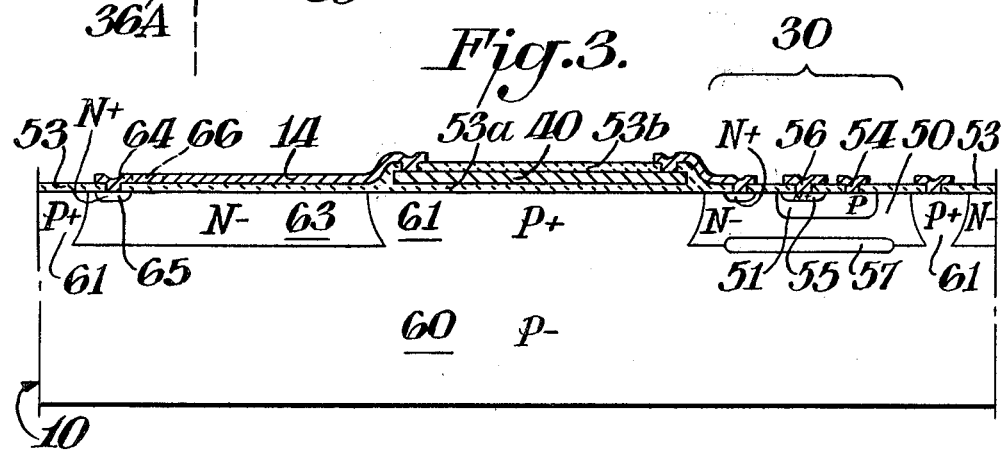
FIG. 3 shows a composite side sectional view of a protected NPN transistor and a protected associated polysilicon resistor that have corresponding elements in the diagram of FIG. 1.

Transistor 30 is formed in an epitaxial pocket 50. The structure of transistor 30 is illustrated in FIG. 3. The base region 51 is contacted through a hole in an insulative silicon dioxide film 53 by a metal film 54. The emitter 55 is contacted through a hole in the silicon dioxide film 53 by metal film 56. The usual buried layer 57 lies at the interface between pocket 50 and the underlying P-substrate 60. Heavily P-doped walls 61 provide PN junction isolation for the epitaxial pockets 50 and 63 as well as for pockets not shown in FIG. 3.

The polysilicon resistor 40 is formed over the silicon dioxide film 53a. Contacts to the distal ends of resistor 40 are made through holes in the overlying silicon dioxide film 53b.

Figure 4:
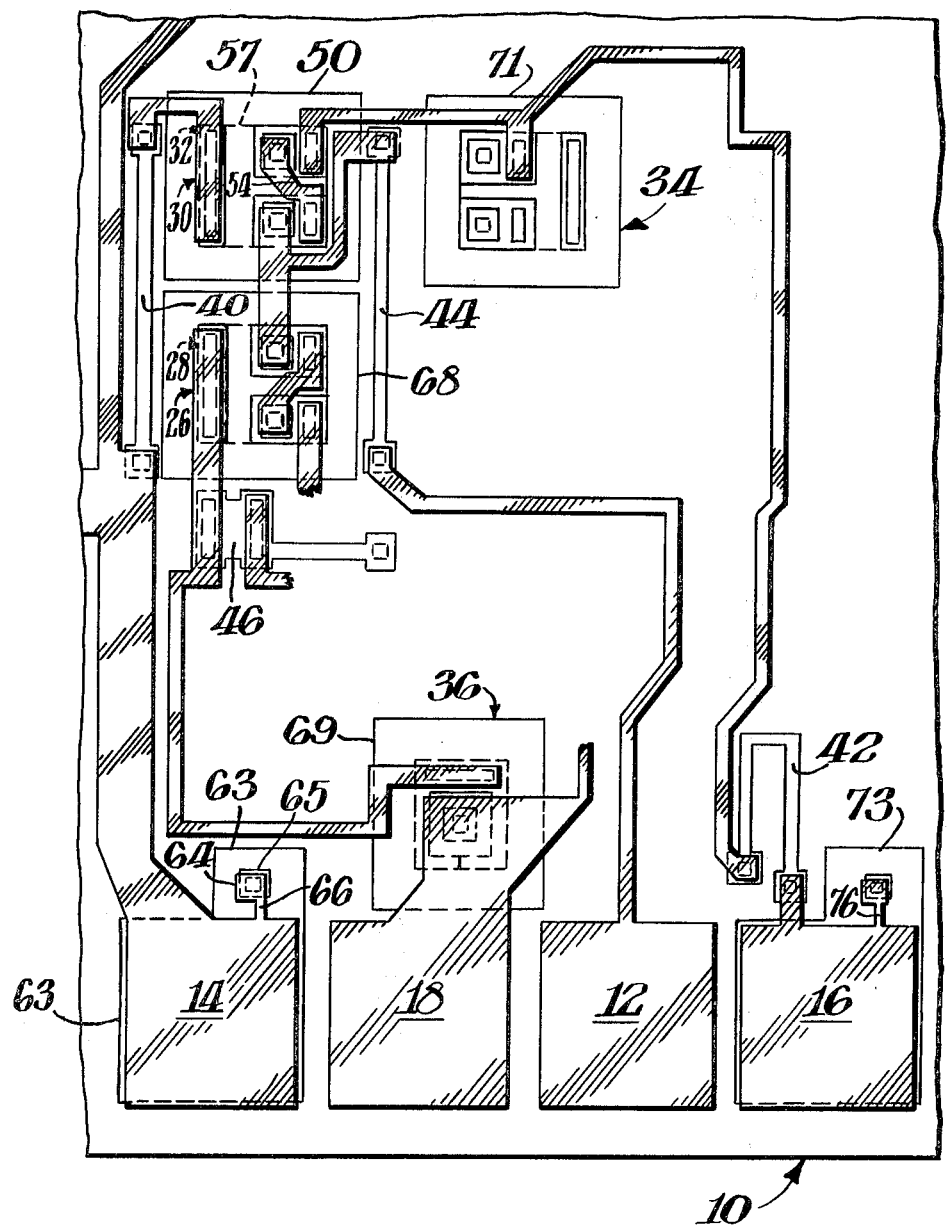
FIG. 4 shows a top view of the portion of the protected integrated circuit schematically shown in FIG. 1.

The metal termination pad 14, namely the +Vcc pad, is deposited over the portion of silicon dioxide film 53 that overlies the epitaxial pocket 63. A metal film 64 makes contact with the small region 65 that is heavily doped with N-type impurities to insure ohmic contact between metal film 64 and pocket 63. Film 64 is contiguous with a narrow metal film 66 that serves as a fuse link connecting the pad 14 to the metal film 64. The narrow feature of fuse link 66 is seen in FIG. 4.

Transistors 30 and 32 having common collectors, are both formed in the epitaxial N-type pocket 50. Pocket 50 forms a PN-junction 50n with the substrate 60 and isolation walls 61. Likewise the pocket 68 contains the two transistors 26 and 28 and forms a PN isolation diode 68n with the substrate 60 and walls 61. Diode 36 is in pocket 69 being isolated by diode 69n while transistor 34 is in pocket 71 that is isolated by diode 71n.

The diode 63n, formed at the interface of pocket 63 and substrate 60 with walls 61, serves a purpose other than conventional isolation. During IC manufacture, handling and ultimate assembly into an electrical system, diode 63n serves to provide a circuit path by which static charge, that may accumulate on the exposed pad 14, may be conveyed to substrate 60 to prevent high static induced voltages from building up across the insulative film 53a between polysilicon resistor 40 and underlying wall 61.

After the integrated circuit is wired into an electrical system there exists a danger that it may be destroyed by accidental reversal of the DC power source, namely in this embodiment by a connection of the negative and positive terminals of battery 20 to the +Vcc pad 14 and ground pad 12, respectively. A large sustained current in the forward direction through diode 63n would overheat the IC leading to its destruction. Fuse link 66 is provided to open this circuit moments after the initiation of such a large forward current to limit its heating effect to a small safe value. The need to protect the IC from static charge build-up does not exist any longer after the IC is connected into an electrical system and thus both the diode 63n and open fuse link 66 have typically served their protective purposes early in the useful life of the integrated circuit.

The lightly doped substrate 60 and epitaxial pocket 63 form a diode 69n having a medium high breakdown voltage that, in conventional IC structures in which it is envisioned the invention may be practiced, will be greater than the battery voltage and less than the breakdown voltage of the silicon dioxide film 53a that insulates the polysilicon resistor 40 from the substrate 60. Typically the dopant concentration of the epitaxial layer (63) is $2 \times 10^{15}/cm^3$ leading to a breakdown voltage of diode such as 63n of about 150 volts. Silicon dioxide insulating layers (53a) over isolation walls (61) of typically 8000 angstroms thickness have a breakdown voltage of about 500 volts. Protection against excessive static charge of either polarity is thus provided.

Polysilicon resistors from a Vcc pad (14) to a pocket (50) such as resistor 40 serve to limit the current that would flow through the pocket (50) via forward biased pocket to iso-wall diode (50n) on the occasion of accidental reversal of the DC supply connection. It is therefore a preferred feature of this invention that any ohmic path connecting the Vcc pad (14) to any epitaxial pocket except the fuse link protected pocket 63, must include a polysilicon resistor to so limit such reverse current.

Terminal pad 16 is also provided a protective diode 73n (see FIG. 1) formed at the interface of epitaxial pocket 73 and the substrate 60 with walls 61 (see FIG. 4). This diode 73n is shown connected to pad 16 via fuse link 76. Here the diode 73n protects polysilicon resistor 42 from accumulating high static charge while fuse link 76 will blow in the event of battery reversal and the closing of override switch 25.

Terminal 18 is not protected in the same way. Static charge can leak through the diode 69n from resistor 46. No fuse is needed here because diode 36 would block reverse battery current if terminal 18 were to be externally connected for any reason to the terminal 14.

A particularly appropriate method for making the polysilicon resistors of this invention, as well as the integrated transistors, is described by Miles and Emerald in U.S. Pat. No. 4,225,877 that is incorporated herein by reference. This patent entitled, Integrated Circuit With C-Mos Logic and a Bipolar Driver with Polysilicon Resistors, issued Sept. 30, 1980 is assigned to the same assignee as is the present invention.

What is claimed is:

1. An integrated circuit with protection against reversed power supply including a silicon substrate of one conductivity type having grown on one face thereof an epitaxial layer of the other type that is divided into a plurality of PN junction-isolated pockets, an insulative film over the outer surface of said epitaxial layer, a pair of metal termination pads on said insulative film consisting of a ground pad ohmically connected to said substrate and a Vcc pad, said pair of pads being adapted for connecting the integrated circuit to a DC power source, wherein the improvement comprises a fusible link making a low resistance connection between a first of said pockets and said Vcc pads; and a group of polysilicon resistors having been formed on said insulative film, said PN junction isolated pockets being N-type and being separated by a P-type isolation wall, said polysilicon resistors being positioned over portions, respectively, of said P-type isolation wall, each of said group of resistors completing, respectively, an ohmic connection between each of a group of the others of said pockets and said Vcc pad, so that static charge that is picked up by said Vcc pad during manufacture and assembly in an electrical system will be diverted to the substrate via said fuse link and the isolation diode of said first pocket to prevent destructively high voltage from building up across said insulative layer between said group of polysilicon resistors and said substrate, and so that after assembly and on the occasion of inadvertent reverse connection of said DC supply to said pads, the high potentially destructive current that would flow in the forward direction through the PN junction between said first pocket and said substrate will open said fuse link.

2. The integrated circuit of claim 1 wherein said group of pockets includes all of said others of said pockets that are ohmically connected to said Vcc pad.

3. The integrated circuit of claim 1 wherein said $V_{cc}$ pad is located over said first pocket to which said fuse link is connected.

4. The integrated circuit of claim 1 wherein the reverse breakdown voltage of the PN junctions, between said pockets and said substrate is less than the breakdown voltage of the portion of said insulative film over which said polysilicon resistor is formed.

* * * * *